(12) United States Patent
Kakuta

(10) Patent No.: US 7,934,875 B2
(45) Date of Patent: May 3, 2011

(54) METHOD FOR ARRANGING FLEXIBLE PRINTED WIRING BOARD IN LENS BARREL OF AN IMAGING DEVICE, AND IMAGING DEVICE USING FLEXIBLE PRINTED WIRING BOARD ARRANGED BY THE SAME METHOD

(75) Inventor: Yoshio Kakuta, Saitama (JP)

(73) Assignee: Tamron Co., Ltd., Saitama (JP)

( * ) Notice: Subject to any disclaimer, the term of this patent is extended or adjusted under 35 U.S.C. 154(b) by 42 days.

(21) Appl. No.: 12/470,071

(22) Filed: May 21, 2009

(65) Prior Publication Data
US 2009/0324210 A1    Dec. 31, 2009

(30) Foreign Application Priority Data

May 22, 2008    (JP) ................... 2008-134736

(51) Int. Cl.
*G03B 17/04* (2006.01)
(52) U.S. Cl. ......... 396/349; 396/542; 359/694; 348/374
(58) Field of Classification Search ............. 396/72, 396/349, 542; 348/374; 359/694
See application file for complete search history.

(56) References Cited

U.S. PATENT DOCUMENTS

| | | | | |
|---|---|---|---|---|
| 5,655,171 | A | * | 8/1997 | Machida et al. .............. 396/535 |
| 5,717,969 | A | * | 2/1998 | Miyamoto et al. ........... 396/535 |
| 5,884,105 | A | * | 3/1999 | Nomura et al. ................ 396/72 |
| 6,493,511 | B2 | * | 12/2002 | Sato ................................ 396/72 |
| 2007/0019950 | A1 | | 1/2007 | Tanaka |
| 2009/0040369 | A1 | * | 2/2009 | Miyoshi ....................... 348/374 |

FOREIGN PATENT DOCUMENTS

JP    11-337797 A    12/1999
JP    2007-33699 A    2/2007

* cited by examiner

*Primary Examiner* — Christopher E Mahoney
*Assistant Examiner* — Fang-Chi Chang
(74) *Attorney, Agent, or Firm* — The Webb Law Firm

(57) ABSTRACT

An object of the present invention is to provide a method for arranging an FPC in a lens barrel of an imaging device which allows installation of new function to an imaging device without eliminating function installed and size up. To solve the problem, the FPC electrically connect plurality of a optical elements movable which constitute an optical unit arranged movably along the optical axis, to the control unit that controls the operation of the optical elements movable, is made to comprise an extension section extending from a connector of the control unit in a state able to be fixed to a lens barrel, a fixed section fixed to the lens barrel, and a bent turn back section extending from the fixed section and then turn back in a loop shape with a terminal provided on the edge, and the terminal is connected to the optical element movable constituting the optical unit.

10 Claims, 2 Drawing Sheets

METHOD FOR ARRANGING FLEXIBLE PRINTED WIRING BOARD IN LENS BARREL OF AN IMAGING DEVICE, AND IMAGING DEVICE USING FLEXIBLE PRINTED WIRING BOARD ARRANGED BY THE SAME METHOD

FIELD OF THE INVENTION

The present invention relates to a method for arranging a flexible printed wiring board in a lens barrel of an imaging device, and an imaging device using a flexible printed wiring board arranged by the same method.

DESCRIPTION OF THE RELATED ART

In imaging devices used to record an image, the optical system is properly adjusted to focus image of a subject on a film or an image sensor. Thus, in many models, functions including automatic focusing, automatic aperture, optical zooming and hand-shake compensation are performed by electronic control using LSI. In a conventional zooming lens, a movable lens barrel in the fixed lens barrel is made to slide to perform the zooming effect. In addition, functions, auto-focusing and hand-shake compensation are also provided in some zooming lenses. However, in video camcorders and digital cameras installed to compact digital camera and/or mobile phone, the lens barrel containing the optical system constitutes a portion of a frame which composes the main portion of video camcorder and/or mobile phone, and thus the lens barrel cannot be seen from the outside. And in models comprising optical zooming function, a movable lens is typically arranged between fixed lenses, and the position of the movable lens is controlled to perform the zooming effect.

Further, a digital camera is typically installed as a standard device in mobile phones and requirement on miniaturization and high performance has been increased. As described above, the digital control using LSI is used for the control of various types of functions in mobile phones. That is, the functions such as auto-focusing, optical zooming and hand-shake compensation digitally controlled by LSI are provided to digital cameras installed in mobile phones. In order to perform those functions, the digital camera comprises a lens moving unit in the lens barrel, and the movement of lens is controlled based on detected image information and the like, so that an image is optimally focused. Further, recently, with increasing demands for a large number of pixels with high functions, a demand for shutter function has been arisen. That is, when a zooming function is provided, the movable lens and the shutter unit move together. Consequently, wirings used to electrically control the shutter unit must have flexibility. Thus, a flexible printed wiring board (hereinafter referred to as "FPC") which is made from a substrate, a flexible copper clad laminate (hereinafter referred to as "FCCL") is usually used.

Japanese Patent Laid-Open No. 11-337797 discloses a technology using FPC in a conventional zooming lens. Specifically, the subject of the technology is to provide an FPC arranged in the multi-stage lens barrel which does not require a complex structure to perform a small-size and high magnification, and also an arrangement structure having less interference with internal devices. More specifically, an FPC is provided in a multiple extension lens barrel in which a second guide barrel is supported movably in a direction of optical axis relative to a first guide barrel in the first guide barrel fixed to an outer barrel combined to a mount barrel. In addition, a movable frame holding a group of lenses and an electromagnetic aperture unit is supported movably in a direction of optical axis relative to the second guide barrel in the second guide barrel. Wherein, a circuit board is fixed to the second guide barrel in a circumferential direction thereof, and the first FPC and the second FPC, of which one ends are connected to the circuit board are electrically connected respectively to an electrical terminal of the mount barrel and an electrical device on the movable frame at each of other ends in a different radial direction with a U-turn section.

Japanese Patent Laid-Open No. 2007-33699 discloses a technology to perform miniaturization of an imaging device comprising an FPC used for electrical connection to a shutter unit which moves in a housing. Specifically, a ribbon section of an FPC electrically connected to a shutter unit fixed to a lens which moves in a direction of optical axis in a housing, extends along a rear side of the shutter unit while bent in a direction of optical axis to electrically connect the ribbon section to outside of the module. With such structure, when the shutter unit moves in a direction of optical axis, the ribbon section is not made bent and keeps its curvature substantially, so the force deforming the ribbon section is small; thus the load of a drive motor required to move the shutter unit can be reduced to enable downsizing of the motor with less power consumption. Also, there is no need to provide a concave space for deforming the ribbon section in the housing, thus miniaturization of the housing is performed.

However, according to the technology disclosed in Japanese Patent Laid-Open No. 11-337797, in order to support both the first guide barrel and movable frame movably in a direction of optical axis while the FPC is placed between the second guide barrel and the first guide barrel, a margin spaces are required between the second guide barrel and the first guide barrel, and between the second guide barrel and the movable frame. Consequently, as a result of miniaturization, when the second guide barrel and the movable frame move, friction between an internal wall of the barrel and the FPC may occur. When friction occurs, a cover layer of the FPC may be damaged to cause tracking, or cracks may appear in the wirings. In addition, the functions, auto-focusing and/or aperture adjustment may not be performed. Further, when the FPC is arranged to occupy a large space not to interrupt the optical path for image focusing, miniaturization might be hardly performed.

According to the technology disclosed in Japanese Patent Laid-Open No. 2007-33699, as illustrated in FIG. 3(*a*), length of the FPC 23 is arranged to extend in a range where a movable lens barrel with shutter moves, and is fixed while bent to a great degree. When the movable lens barrel moves, the FPC 23 is set in a space between the movable lens barrel and the fixed lens barrel with different shape of bending as shown in a comparison between FIG. 3(*b*) and FIG. 3(*c*). However, as evident from FIG. 3(*b*) and FIG. 3(*c*), bending shape of the FPC 23 changes while some portion of the FPC 23 is in contact with a portion of the frame at all times. Consequently, as the lens barrel slidable does not move smoothly and/or gets vibration, an improper operation may be caused by friction. Referring to FIG. 3(*b*) illustrating a state in which the movable lens barrel has moved forward, there is a margin space between the bent FPC 23 and the wall, so there is no concern about a contact between the FPC 23 and the frame. In contrast, referring to FIG. 3(*c*) illustrating a state in which the movable lens barrel has moved backward to the limit, a margin must be provided in the space so that the FPC 23 and the frame are not brought into contact with each other. That is, in designing of an imaging device, an optical system must be designed which has certain length for an optical axis for which the space required is considered, and it might be drawback for miniaturization. Further, with the above structure, when devices corresponding to the function such as hand-shake compensation and aperture adjustment are provided, terminals for connection with the devices must be formed in the FPC, and it may make the outer shape of the FPC complex. As a result, the yield of FCCL is made lower, and it may make the amount of waste increase and resources waste.

That is, for an imaging device in which optical elements are movably arranged in the fixed lens barrel, there is a demand for a method for arranging an FPC to which additional function can be provided while the conventional function is not changed and the original size is substantially maintained.

SUMMARY OF THE INVENTION

As a result of diligent study to solve the problems, the present inventor has thought out the following method for arranging an FPC in a lens barrel of an imaging device and the following imaging device using the same method, and then the problems have been solved.

The method for arranging an FPC in a lens barrel of an imaging device according to the present invention: The method for arranging an FPC in a lens barrel of an imaging device according to the present invention is a method for arranging a flexible printed wiring board which electrically connects a plurality of optical elements that constitute an optical unit and arranged movable along an optical axis, to a control unit that controls the operation of the optical elements movable, in a lens barrel of an imaging device, which is characterized in that the FPC comprises a first wiring section and a second wiring section. Then, the first wiring section comprises a first extension section extending from a connector of the control unit in a state able to be fixed to a lens barrel, a first fixed section fixed to the lens barrel, and a first bent turn back section extending to a subject side from the first fixed section and then turn back in a loop shape, and a first terminal provided on the edge of the first bent turn back section is connected to a first optical element movable constituting the optical unit. Next, the second wiring section comprises a second extension section extending from a connector of the control unit in a state able to be fixed to the lens barrel, a second fixed section fixed to the lens barrel, and a second bent turn back section extending to an image focusing side from the second fixed section and then turn back in a loop shape, and a second terminal provided on the edge of the second bent turn back section is connected to a second optical element movable constituting the optical unit.

In the method for arranging an FPC in a lens barrel of an imaging device according to the present invention, it is preferable that: the optical unit comprises a first lens frame in a subject side; and when the first optical element movable is set close to the first lens frame, the first bent turn back section is held in a first space provided between the first lens frame and the lens barrel.

In the method for arranging an FPC in a lens barrel of an imaging device according to the present invention, it is preferable that: the optical unit comprises a second lens frame in an image focusing side; and when the second optical element movable is set close to the second lens frame, the second bent turn back section is held in a second space provided between the second lens frame and the lens barrel.

In the method for arranging an FPC in a lens barrel of an imaging device according to the present invention, the first fixed section is arranged in a subject side range separate from a movable range of the first terminal.

In the method for arranging an FPC in a lens barrel of an imaging device according to the present invention, the second fixed section is arranged in an image focusing side range separate from a movable range of the second terminal.

In the method for arranging an FPC in a lens barrel of an imaging device according to the present invention, it is preferable that: the first terminal is connected to a terminal provided on a subject side of the first optical element movable, and the second terminal is connected to a terminal provided on an image focusing side of the second optical element movable.

In the method for arranging an FPC in a lens barrel of an imaging device according to the present invention, the first fixed section and the second fixed section are arranged on an outer side of the lens barrel.

The method for arranging an FPC in a lens barrel of an imaging device according to the present invention is a method for arranging, an FPC which electrically connects a plurality of optical elements movable that constitute an optical unit and arranged movable along an optical axis, to a control unit that controls the operation of the optical elements movable, in a lens barrel of an imaging device. The FPC comprises a wiring section, and the wiring section comprises an extension section extending from a connector of the control unit in a state able to be fixed to a lens barrel, a fixed section fixed to a surface of a drive source facing wall which exists in the opposite side of the side where the drive source which drives the optical elements movable is arranged in the direction orthogonal to the optical axis of the lens barrel through the optical elements movable, and a bent turn back section extending from the fixed section in the direction parallel to the optical axis along the drive source facing wall to which the fixed sections are fixed and then turn back in a loop shape and a terminal is provided on the edges, and the terminals provided around the drive source facing wall are connected to the connectors of the optical elements movable.

An imaging device according to the present invention: In the imaging device according to the present invention, an FPC is arranged by using the method for arranging the FPC in a lens barrel of an imaging device.

The imaging device according to the present invention is preferable that: the first optical element movable and the second optical element movable are arranged close to each other along the optical axis and also arranged movable together in parallel along the optical axis, the first optical element movable comprises the first connecting section to be connected to the first terminal of the first wiring section in the subject side, and the second optical element movable comprises the second connecting section to be connected to the second terminal of the second wiring section in the image focusing side.

ADVANTAGE OF THE INVENTION

The method for arranging an FPC in a lens barrel of an imaging device according to the present invention is a method for arranging a flexible printed wiring board which electrically connects a plurality of optical elements that constitute an optical unit and arranged movable along an optical axis, to a control unit that controls the operation of the optical elements movable, in a lens barrel of an imaging device. The FPC comprises a first wiring section and second wiring section. The first wiring section comprises a first extension section extending from a connector of the control unit in a state able to be fixed to a lens barrel, a first fixed section fixed to the lens barrel, and a first bent turn back section extending to a subject side from the first fixed section and then turn back in a loop shape and a first terminal provided on the edge is connected to a first optical element movable constituting the optical unit. The second wiring section comprises a second extension section extending from a connector of the control unit in a state able to be fixed to the lens barrel, a second fixed section fixed to the lens barrel, and a second bent turn back section extending to an image focusing side from the second fixed section and then turn back in a loop shape and a second terminal provided on the edge is connected to a second optical element movable constituting the optical unit. When the FPC arranged by using the method described above is applied, the space occupied by wiring may be reduced to protect the FPC from friction with the internal wall of the lens barrel even an optical element such as a shutter driving actuator and iris driving actuator is arranged in a lens barrel and the moving range of the optical element is set wide. As a result, an imaging device is made possible to be able to use over a long period of time. Further, movement of the optical elements is made smoother, and result improved function on image adjustment.

DETAILED DESCRIPTION OF THE PREFERRED EMBODIMENTS

Figure 1:
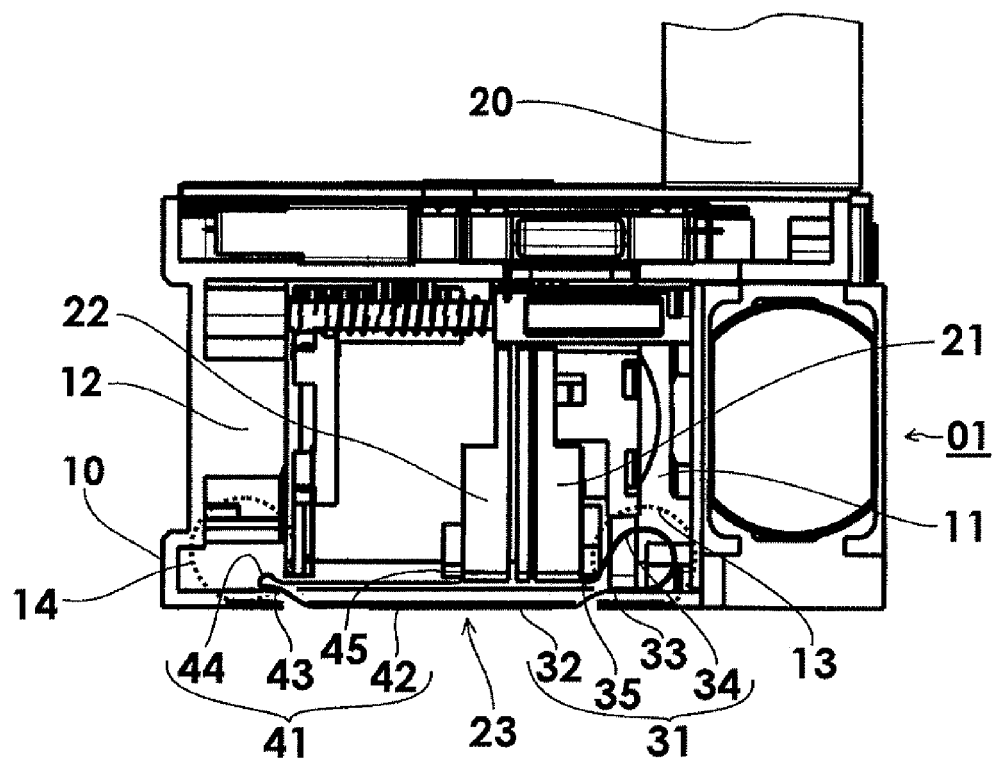
FIG. 1 is a schematic view illustrating an arrangement of an element in an imaging device according to the present invention using a method for arranging an FPC in a lens barrel of an imaging device.

A method for arranging an FPC in a lens barrel of an imaging device according to the present invention will be described below with reference to FIG. 1.

The method for arranging an FPC in a lens barrel of an imaging device of the present invention: The method for arranging an FPC in a lens barrel of an imaging device according to the present invention is a method for arranging an FPC which electrically connects a plurality of optical elements that constitute an optical unit and arranged movable along an optical axis, to a control unit that controls the operation of the optical elements movable, in a lens barrel of an imaging device. As shown in FIG. 1, the FPC 23 comprises the first wiring section 31 and the second wiring section 41. The first wiring section 31 is a wiring comprising the first extension section 32 extending from a connector of the control unit 20 in a state able to be fixed to a lens barrel 10, the first fixed section 33 fixed to the lens barrel 10, and the first bent turn back section 34 extending to a subject side from the first fixed section 33 and then turn back in a loop shape and the first terminal 35 provided on the edge is connected to the first optical element movable constituting the optical unit. The second wiring section 41 is a wiring comprising the second extension section 42 extending from a connector of the control unit in a state able to be fixed to the lens barrel 10, the second fixed section 43 fixed to the lens barrel 10, and the second bent turn back section 44 extending to an image focusing side from the second fixed section 43 and then turn back in a loop shape and the second terminal 45 provided on the edge is connected to a second optical element movable constituting the optical unit.

The optical unit according to the present invention is a unit composed of optical elements, such as a lens groups, shutter element and aperture diaphragm, arranged fixedly or movably in a lens barrel of an imaging device. As described above, when the control unit and the optical elements movable that constitute the optical unit are connected via the wiring section having a bent turn back section formed close to the optical element movable, the length required for the bent turn back section to make the optical element movable can be made short. That is, the radius of a loop formed in the bent turn back section is made small, so the optical system is not affected. Further, the wiring sections can be arranged in an overlapped manner and/or separately, so arrangement of the FPC has a large degree of freedom. In such arrangement, the number of wiring sections arranged in the lens barrel is not limited to two (the first wiring section 31 and second wiring section 41); a third wiring section and fourth wiring section may also be arranged. In addition, since the degree of freedom in designing an FPC is large, the yield of an FPC cut from FCCL may be improved.

The first bent turn back section 34 is arranged in a subject side from the first fixed section 33, and the second bent turn back section 44 is arranged in an image focusing side from the second fixed section 43. As is evident in FIG. 1, such arrangement of the FPC 23 requires a greatest length of the FPC. However, such structure make response of a loop formed in the bent turn back section against to the movement of the optical element stable. Thus, the method for arranging an FPC in a lens barrel of an imaging device according to the present invention should be very interest in the shape of bent turn back section, the first bent turn back section 34 is arranged in a subject side from the first fixed section 33, and the second bent turn back section 44 is arranged in an image focusing side from the second fixed section 43.

Figure 2:
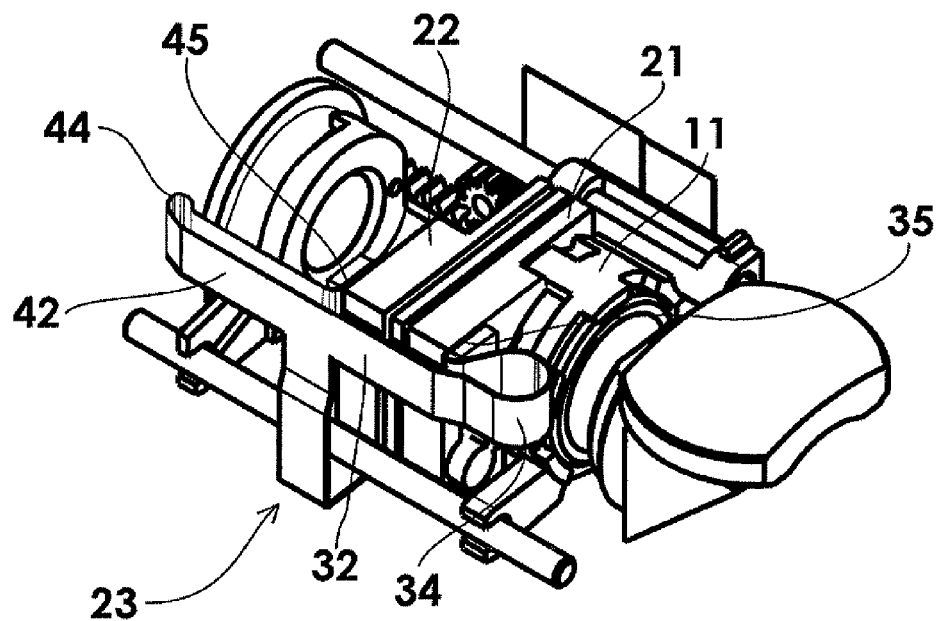
FIG. 2 is a schematic perspective view illustrating a specific example for arranging an FPC in a lens barrel of an imaging device according to the present invention.
Figure 3:
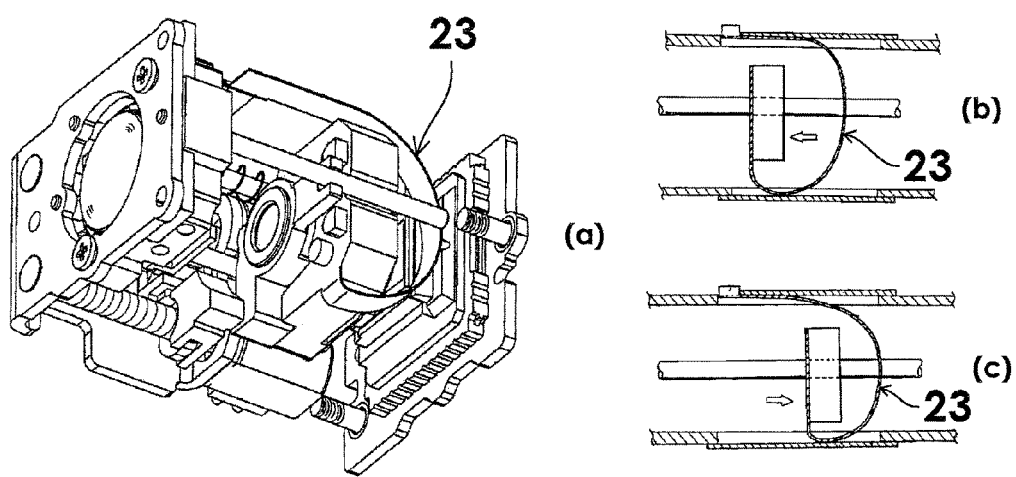
FIG. 3 is a schematic view illustrating an FPC arrangement and operation disclosed in Japanese Patent Laid-Open No. 2007-33699.

To ease understanding of the arrangement of the FPC 23, FIG. 2 illustrates the arrangement in which the first optical element movable (21: shutter driving actuator) is arranged in the subject side of the lens barrel 10, and the second optical element movable (22: iris driving actuator) is arranged in the image focusing side of the lens barrel 10 close to the first optical element movable. In the arrangement illustrated in FIG. 2, the extension section connected to the control unit 20 extends to the outside of the lens barrel 10 which includes a common wiring for both the first wiring section 31 and the second wiring section 41, and further extends along an external wall of the lens barrel 10 in a state surrounding the optical axis. Then, the common wiring section branches to form a "T" shape. One branch, the first wiring section 31 extends on the external wall of the lens barrel 10 in a direction parallel to the optical axis to the first fixed section 33, and forms the first bent turn back section 34 which extends to a subject side from the first fixed section 33 and then turn back in a loop shape and reaches to the first terminal 35, and the first terminal 35 is connected to an input terminal (not illustrated) of the first optical element movable 21. Another branch, the second wiring section 41 is arranged similarly to the first wiring section 31. As is shown in the example above, when a construction is applied in which the extension section connected to the control unit 20 is made to be a common wiring section instead of an independent wiring which comprises a common line such as a power source line and separated into the extension sections, the area of FCCL required to fabricate the FPC 23 can be reduced. Further, as the extension section connected to the control unit can be made small and uniform in thickness, the design is preferable for space saving.

In the method for arranging an FPC in a lens barrel of an imaging device according to the present invention, the optical unit comprises a first lens frame 11 in a subject side, and when the first optical element movable 21 is set close to the first lens frame 11, the first bent turn back section 34 is held in a first space 13 provided between the first lens frame 11 and the lens barrel 10.

In the method for arranging an FPC in a lens barrel of an imaging device according to the present invention, the optical unit comprises a second lens frame 12 in an image focusing side, and when the second optical element movable 22 is set close to the second lens frame 12, the second bent turn back section 44 is held in a second space 14 provided between the second lens frame 12 and the lens barrel 10. The first space 13 and the second space 14 are formed according to the substantially same concept. So, only the first wiring section 31 will be described below in detail and a detailed explanation on the second wiring section 41 will be omitted.

To maximize the function of the first optical element movable 21, the moving range of the first optical element movable 21 is preferable to be in maximum. By the way, the first optical element movable 21 may be set close to the first lens frame 11. In such case, the gap between the first lens frame 11 and lens barrel 10 required to making the first lens frame 11 movable is narrow and it cannot hold the first bent turn back section. Consequently, the first bent turn back section 34 formed in a loop shape between the first fixed section 33 and first terminal 35 may come into contact with the first lens frame 11 and deforms. Thus, in order to prevent the first bent turn back section 34 from contact to the first lens frame 11, the moving ranges of the first terminal 35 and first lens frame 11 must be regulated at a location where the first bent turn back section 34 is not deformed. As a result, the moving ranges of the first optical element movable and the first lens frame may be limited. However, according to the present invention, the first space 13 is provided between the first lens frame 11 and lens barrel 10 to hold the first bent turn back section 34. So, the first optical element movable 21 can be set close to the first lens frame 11. Further, when the first bent turn back section 34 is held in the first space 13, the first bent turn back section 34 is prevented from interrupting the optical path required for capturing a subject image, and hardly affect on the quality of image. Also, when a third optical element and fourth optical element are arranged movably, the similar design can be applied.

In the method for arranging an FPC in a lens barrel of an imaging device according to the present invention, the first fixed section 33 is arranged in the subject side range separate from a movable range of the first terminal 35.

In the method for arranging an FPC in a lens barrel of an imaging device according to the present invention, the second fixed section 43 is arranged in the image focusing side range separate from a movable range of the second terminal 45. The first fixed section 33 and second fixed section 43 are formed according to the substantially same concept. So, only the first wiring section 31 will be described in detail below and a detailed explanation on the second wiring section 41 will be omitted.

As described above, when the first fixed section 33 is arranged in a subject side range separate from the movable range of the first terminal 35, the first terminal 35 provided on one edge of the first bent turn back section for turn back 34 is prevented from coming into contact with the first fixed section 33 connected to another edge of the first bent turn back section 34. By the way, when the first terminal 35 is set at the edge of the movable range in image focusing-side, the radius of a loop formed in the first bent turn back section 34 is made minimum. Consequently, in the present invention, the length of the first bent turn back section 34 is set longer than the length of movable range of the first terminal 35 in consideration of the position of the first fixed section 33 not to apply stress to the FPC 23 and/or to prevent the bending angle from to be close 180 degrees.

As described above, when the first terminal 35 is set at the edge of the movable range in the image focusing-side, the radius of a loop formed in the first bent turn back section 34 is made minimum, independent of the length of the first bent turn back section 34. However, while the bending angle of the FPC 23 is less than 180 degrees, when the loop radius is small, open-circuit of the wiring may occur in the FPC 23 of the first bent turn back section 34 due to vibrations and the like in operation. In order to prevent such open-circuit of the wiring hardly estimated, the length of the first bent turn back section 34 is preferably designed in consideration of the fatigue ductility of the FCCL. However, when the radius of loop is set excessively large for the purpose of preventing open-circuit of the wiring, the space occupied by the first bent turn back section 34 may be made large. Consequently, in the method for arranging an FPC in a lens barrel of an imaging device according to the present invention, the loop length of the bent turn back section as well as the arrangement of space to hold the bent turn back section is an essential design factor to assure the reliability over a long period of time.

In the method for arranging an FPC in a lens barrel of an imaging device according to the present invention, the first terminal 35 is connected to a terminal provided on a subject side of the first optical element movable 21; and the second terminal 45 is connected to a terminal provided on an image focusing side of the second optical element movable 22. As for the position of connection between the terminal and the optical element, the first terminal 35 and second terminal 45 have the same concept, and hence only the first terminal 35 will be described in detail and a detailed explanation on the second terminal 45 will be omitted.

When the first terminal 35 is connected to the terminal provided in a subject side of the first optical element movable 21, the first terminal is prevented from coming into contact with the loop of the first bent turn back section 34 and also prevented from coming into contact with the internal wall of the lens barrel 10 to cause friction. As a result, open-circuit of the wiring and/or migration caused by the friction can be effectively prevented. Further, the properly formed loop shape in the bent turn back section performs a function of reducing stress given to the connecting portion to result improved reliability of connection also. In contrast, when the first terminal 35 is connected to the image focusing side of the first optical element movable 21, the loop of the first bent turn back section 34 changes its loop shape according to the movement of the first optical element movable 21 while in contact with the first optical element movable 21, and thus cause friction. Also, when soldering and the like are performed for connection, a thickness of the connecting portion may vary. Consequently, when the connection is performed on the plane parallel to the optical axis of the first optical element movable 21, the thickness of the connecting portion may have a large variation, and then the connecting portion may come into contact with the lens barrel 10 to result affection on the movement of the first optical element movable 21. So, it is not preferable.

In the method for arranging an FPC in a lens barrel of an imaging device according to the present invention, the first fixed section 33 and the second fixed section 43 are arranged on the outer side of the lens barrel 10. As disclosed in Patent Document 1, a section, such as a common wiring section of FPC which is not required flexibility is usually fixed along the wall surface of the lens barrel and the like. However, when an extension section and the like separate from the internal wall, the FPC may come into contact with the optical elements movable if optical elements movable are arranged inside of the lens barrel 10, and it may interrupt the movement of the shutter driving actuator and/or iris driving actuator. Thus, it is preferred that inside of the lens barrel 10 is provided only the bent turn back section not to come into contact with the optical elements, and the first fixed section 33 and second fixed section 43 are arranged on the outer side of the lens barrel 10. Further, the first extension section 32 and second extension section 42 are also preferably arranged on the outer side of the lens barrel 10. When the extension sections as well as the fixed sections are arranged on the outer side of the lens barrel 10, if the fixed section is apart from the lens barrel 10, the optical elements movable are prevented from coming into contact with the FPC not to affect the movement of the optical elements movable. Also, the sections separated are easy to repair.

The method for arranging an FPC in a lens barrel of an imaging device according to the present invention is a method for arranging, an FPC which electrically connect a plurality of optical elements movable that constitute an optical unit and arranged movable along an optical axis, to a control unit that controls the operation of the optical elements movable, in a lens barrel of an imaging device. The FPC comprises a wiring section, and the wiring section comprises an extension section extending from a connector of the control unit in a state able to be fixed to a lens barrel, a fixed section fixed to a surface of a drive source facing wall which locates in the opposite side of the side where the drive source which drives the optical elements movable is arranged in the direction orthogonal to the optical axis of the lens barrel through the optical elements movable, and a bent turn back section extending from the fixed section in the direction parallel to the optical axis along the drive source facing wall to which the fixed sections are fixed and then turn back in a loop shape and a terminal is provided on the edges, and the terminals arranged around the drive source facing wall are connected to the connectors of the optical elements movable. In this way, when the terminal is connected to the connecting section of the optical element movable arranged around the drive source facing wall surface, the wiring between the fixed section and the terminal provided can be finished around the drive source facing wall. So, when the optical element movable moves, the flexible printed wiring board is prevented from coming into contact with another element, thus the optical element movable is made its movement smooth, and reliability of the optical system is improved. The descriptions above are specified to disclose a method for arranging a flexible printed wiring board in a lens barrel of an imaging device when two optical elements movable are arranged. However, the method for arranging a flexible printed wiring board in a lens barrel of an imaging device according to the present invention is not limited for two optical elements movable, but a larger number of optical elements movable may be arranged.

An imaging device according to the present invention: An imaging device according to the present invention is an imaging device in which an FPC is arranged by using a method for arranging the FPC in the lens barrel of an imaging device. As illustrated in FIG. 1, the imaging device 01 comprises the FPC 23 which electrically connects a plurality of optical elements movable that constitute an optical unit arranged movably along optical axis, to a control unit 20 that controls the operation of the optical elements movable. As the imaging devices provided with a lens barrel in a frame of the devices, digital cameras contained in mobile phone, compact digital cameras and video camcorders can be exemplified. For example, when the method for arranging the FPC of the present invention is applied to a digital camera contained in mobile phone, an analysis on the focused images can be utilized for zooming or focal depth adjustment without increasing of the cost and/or up-size of the main body. That is, in mobile phones, image recorded is made clear. When the method is applied to a compact digital camera and the like, a space margin for element arrangement is improved. Thus, the imaging device according to the present invention is small in size, but performs multi-functions.

In the imaging device according to the present invention, the first optical element movable and second optical element movable are arranged close to each other in a direction of optical axis and also arranged movable together along the optical axis. The first optical element movable comprises the first connecting section in a subject side to be connected to the first terminal of the first wiring section. The second optical element movable comprises the second connecting section in an image focusing side to be connected to the second terminal of the second wiring section. Because the first optical element movable comprises the first connecting section in a subject side, and the second optical element movable comprises the second connecting section in an image focusing side, even when they are set close to each other in a direction of optical axis, the first optical element movable and second optical element movable can move together along the optical axis. Further, the first optical element movable and the second optical element movable get tension in a direction opposite to each other in the motion to incline in a direction opposite to each other from the optical axis. It means that the image focusing optical path may be hardly affected. That is, the imaging device is an imaging device provided with improved reliability in optical system.

INDUSTRIAL APPLICABILITY

The method for arranging an FPC in a lens barrel of an imaging device according to the present invention is the method for arranging the FPC which electrically connects the plurality of optical elements that constitute the optical unit and arranged movable along the optical axis, to the control unit that controls the operation of the optical elements movable, in the lens barrel of an imaging device. The FPC comprises the first wiring section and the second wiring section. The first wiring section comprises the first extension section extending from the connector of the control unit in a state able to be fixed to the lens barrel, the first fixed section fixed to the lens barrel, and the first bent turn back section extending to a subject side from the first fixed section and then turn back in a loop shape and the first terminal provided on the edge is connected to the first optical element movable constituting the optical unit. The second wiring section comprises the second extension section extending from the connector of the control unit in a state able to be fixed to the lens barrel, the second fixed section fixed to the lens barrel, and the second bent turn back section extending to the image focusing side from the second fixed section and then turn back in a loop shape and the second terminal provided on the edge is connected to the second optical element movable constituting the optical unit. When the FPC is arranged with the above arrangement method, the space occupied by the FPC is reduced to prevent friction between the FPC and the internal wall of the lens barrel or optical elements even when the maximum moving range is provided for the plurality of an optical elements movable. As a result, it is made possible to provide an imaging device able to use over a long period of time. Further, as motion of the optical elements can be made smoother, image adjustment is improved. Further, as the arrangement of the optical elements supported movably along the optical axis is made free, an ND element, polarization element and the like which have been considered to be installed only in single-lens reflex cameras may also be installed.

What is claimed is:

1. A method for arranging a flexible printed wiring board which electrically connects a plurality of optical elements that constitute an optical unit and arranged movable along an optical axis, to a control unit that controls the operation of the movable optical elements, in a lens barrel, the method comprising the steps of:

providing the flexible printed wiring board comprising a first wiring section, a second wiring section, and a common wiring section which comprises a common wiring provided for both the first wiring section and the second wiring section connected to the control unit, the first wiring section comprises a first extension section extending from a common wiring section to a subject side in a state able to be fixed to a lens barrel, a first fixed section fixed to the lens barrel, a first bent turn back section extending to a subject side from the first fixed section and then turning back in a loop shape, and a first terminal to be connected to a first movable optical element of the optical unit is provided on an edge of the first bent turn back section; and the second wiring section comprises a second extension section extending from a common wiring section to a focusing side in a state able to be fixed to the lens barrel, a second fixed section fixed to the lens barrel, a second bent turn back section extending to an image focusing side from the second fixed section and then turning back in a loop shape, and a second terminal to be connected to a second movable optical element of the optical unit is provided on an edge of the second bent turn back section; and arranging the flexible printed wiring board to electrically connect at least the first movable optical element and the second movable optical element of the optical unit to the control unit.

2. The method for arranging a flexible printed wiring board in a lens barrel according to claim 1, wherein: the optical unit comprises a first lens frame in a subject side; and when the first movable optical element is set close to the first lens frame, the first bent turn back section is held in a first space provided between the first lens frame and the lens barrel.

3. The method for arranging a flexible printed wiring board in a lens barrel according to claim 1, wherein: the optical unit comprises a second lens frame in an image focusing side; and when the second movable optical element is set close to the second lens frame, the second bent turn back section is held in a second space provided between the second lens frame and the lens barrel.

4. The method for arranging a flexible printed wiring board in a lens barrel according to claim 1, wherein the first fixed section is arranged in a subject side range separate from a movable range of the first terminal.

5. The method for arranging a flexible printed wiring board in a lens barrel according to claim 1, wherein the second fixed section is arranged in an image focusing side range separate from a movable range of the second terminal.

6. The method for arranging a flexible printed wiring board in a lens barrel according to claim 1, wherein: the first terminal to be connected to a terminal of the first movable optical element is arranged on a subject side; and the second terminal to be connected to a terminal of the second movable optical element is arranged on an image focusing side.

7. The method for arranging a flexible printed wiring board in a lens barrel according to claim 1, wherein the first fixed section and the second fixed section are arranged on an outer side of the lens barrel.

8. An imaging device in which a flexible printed wiring board is arranged by using a method for arranging a flexible printed wiring board in a lens barrel according to claim 1.

9. The imaging device according to claim 8, wherein:

the first movable optical element and the second movable optical element are arranged close to each other in a direction of optical axis and also arranged movable together along an optical axis;

the first movable optical element comprises a first connecting section to be connected to the first terminal of the first wiring section in a subject side; and the second movable optical element comprises a second connecting section to be connected to the second terminal of the second wiring section in an image focusing side.

10. A flexible printed wiring board provided to electrically connect a plurality of optical elements that constitute an optical unit and arranged movable along an optical axis, to a control unit that controls the operation of the optical elements, the flexible printed wiring board comprising:

a first wiring section, a second wiring section, and a common wiring section which comprises a common wiring provided for both the first wiring section and the second wiring section connected to the control unit;

the first wiring section comprises a first extension section extending from a common wiring section to a subject side in a state able to be fixed to a lens barrel, a first fixed section fixed to the lens barrel, a first bent turn back section extending to a subject side from the first fixed section and then turning back in a loop shape, and a first terminal to be connected to a first movable optical element of the optical unit is provided on an edge of the first bent turn back section; and the second wiring section comprises a second extension section extending from a common wiring section to a focusing side in a state able to be fixed to the lens barrel, a second fixed section fixed to the lens barrel, a second bent turn back section extending to an image focusing side from the second fixed section and then turning back in a loop shape, and a second terminal to be connected to a second movable optical element of the optical unit is provided on an edge of the second bent turn back section.

* * * * *